(12) United States Patent
Sim et al.

(10) Patent No.: US 7,336,121 B2
(45) Date of Patent: Feb. 26, 2008

(54) NEGATIVE VOLTAGE GENERATOR FOR A SEMICONDUCTOR MEMORY DEVICE

(75) Inventors: Jae-Yoon Sim, Kyunggi-do (KR); Jei-Hwan Yoo, Kyunggi-do (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 418 days.

(21) Appl. No.: 09/901,930

(22) Filed: Jul. 9, 2001

(65) Prior Publication Data
US 2002/0171470 A1 Nov. 21, 2002

Related U.S. Application Data

(60) Provisional application No. 60/288,746, filed on May 4, 2001.

(51) Int. Cl.
*G05F 1/10* (2006.01)

(52) U.S. Cl. .................................. 327/536; 363/60

(58) Field of Classification Search ............... 327/536; 363/60
See application file for complete search history.

(56) References Cited

U.S. PATENT DOCUMENTS

| | | | | |
|---|---|---|---|---|
| 4,961,007 A | * | 10/1990 | Kumanoya et al. | 323/313 |
| 5,191,235 A | | 3/1993 | Hara | |
| 5,337,284 A | * | 8/1994 | Cordoba et al. | 327/540 |
| 5,367,489 A | * | 11/1994 | Park et al. | 365/189.11 |
| 5,434,820 A | * | 7/1995 | Kim | 134/1 |
| 5,535,160 A | * | 7/1996 | Yamaguchi | 365/189.01 |
| 5,553,295 A | | 9/1996 | Pantelakis et al. | |
| 5,600,551 A | * | 2/1997 | Luscher, Jr. | 307/110 |
| 5,708,420 A | * | 1/1998 | Drouot | 327/535 |
| 5,856,918 A | * | 1/1999 | Soneda et al. | 363/60 |
| 5,933,047 A | * | 8/1999 | Zhu et al. | 327/534 |
| 6,031,411 A | * | 2/2000 | Tsay et al. | 327/534 |
| 6,052,022 A | * | 4/2000 | Lee | 307/110 |

(Continued)

FOREIGN PATENT DOCUMENTS

KR 94020909 8/1994

OTHER PUBLICATIONS

1998 Symposium on VLSI Circuits Digest of Technical Papers P94-95 "A precise On-chip voltage Generator for a Giga-Scale DRAM with a Negative Word-line Scheme".
Article from Journal of Solid-State Circuits, vol. 24, No. 3, Jun. 1989, p. 597-602. Entitled: A1-Mbit BiCMOS DRAM Using Temperature-Compensation Circuit Techniques.
Tanaka, Hitoshi, et al., A Precise On-Chip Voltage Generator for a Gigascale DRAM with a Negative Word-Line Scheme, IEEE Journal of Solid-State Circuits, Aug. 1999, pp. 1084-1090, vol. 34, No. 8.
English Language Abstract of Korean Application No. 94020909, Aug. 24, 1994.

*Primary Examiner*—Kenneth B. Wells
(74) *Attorney, Agent, or Firm*—Marger Johnson & McCollom, P.C.

(57) ABSTRACT

A negative voltage generator is controlled responsive to a word line precharge signal. Voltage fluctuations in a negatively biased word line scheme are reduced by using a kicker circuit to provide a predetermined amount of negative charge to shut off a word line during a precharge operation. The negative voltage generator includes first and second negative charge pumps. The second charge pump is activated responsive to the word line precharge signal. A negative voltage regulator can be used to regulate a negative voltage signal. A level shifter uses two voltage dividers and a differential amplifier to reduce response time, output ripple, and sensitivity to process and temperature variations. A negative voltage regulator cancels ripple from a charge pump to provide a stable negative bias voltage and reduce the amount of charge needed to precharge a word line.

11 Claims, 7 Drawing Sheets

U.S. PATENT DOCUMENTS

| | | | |
|---|---|---|---|
| 6,055,186 A * | 4/2000 | Hung et al. | 365/185.18 |
| 6,097,665 A | 8/2000 | Tomishima et al. | |
| 6,147,914 A | 11/2000 | Leung et al. | |
| 6,256,229 B1 * | 7/2001 | Roohparvar | 365/185.18 |
| 6,288,951 B1 * | 9/2001 | Chen et al. | 365/189.09 |
| 6,326,834 B1 * | 12/2001 | Akita et al. | 327/536 |
| 6,329,869 B1 * | 12/2001 | Matano | 327/536 |

* cited by examiner

NEGATIVE VOLTAGE GENERATOR FOR A SEMICONDUCTOR MEMORY DEVICE

This application claims priority from Provisional Application No. 60/288,746, entitled NEGATIVE VOLTAGE GENERATOR IN SEMICONDUCTOR MEMORY DEVICE, filed on May 4, 2001, by the same inventors of the present application, the contents of which are herein incorporated by reference.

BACKGROUND

1. Field of the Invention

The present invention relates generally to semiconductor memory devices, and more particularly, to a negative voltage generator for a semiconductor memory device.

2. Description of the Related Art

A typical semiconductor memory devices utilizes an access transistor in each memory cell to store, read and refresh data in the cell. The refresh time of a memory cell is degraded by the leakage current of the access transistor. A negatively biased word line scheme has been devised to reduce this leakage current. A memory device employing a negative word line scheme applies a negative voltage Vbb or Vnn to the word lines of non-selected memory cells. This is also referred to as back biasing the word line.

FIG. 1 illustrates a prior art negative voltage generator which includes an oscillator 100, a negative charge pump 200 and a level detector 300. The generator of FIG. 1 has commonly been used to generate a negative voltage (Vbb) for reverse biasing the substrate of a semiconductor device, thereby reducing leakage current. Thus, it is often referred to as a substrate voltage generator. It generates a regulated negative voltage supply using a negative feedback operation. When Vbb increases due to substrate leakage current, the detector 300 enables the oscillator 100 which then drives the charge pump 200. The voltage of Vbb is driven more negative by the charge pump until the detector disables the oscillator.

FIG. 2 illustrates a typical prior art Vbb level detector 300. When Vbb increases due to substrate leakage current, the source-drain equivalent resistance of M2 (700) increases, thereby causing the voltage of Node A to rise. When node A reaches the trip point of inverter 900, the output signal OUT goes high and enables the oscillator 100 which then drives the negative charge pump 200 with a rectangular wave signal. The negative charge pump includes a capacitor 400 and two diodes DGND (500) and DSUB (600) which are arranged in a typical negative charge pumping configuration. When the rectangular signal is high, node B is clamped at one threshold voltage (Vth) above ground by DGND, while the other end of the capacitor 400 is charged to the positive supply voltage Vdd. Then, when the rectangular signal goes low, the capacitor pumps negative charge to Vbb through DSUB.

To implement a negatively biased word line scheme, the prior art negative voltage generator described above with reference to FIGS. 1 and 2 has also been utilized to provide the negative bias for the word lines. However, this prior art generator is not very well suited for driving negative word lines. The regulator shown in FIGS. 1 and 2 was originally intended to provide a small amount of current for reverse or back biasing a semiconductor substrate. A negative word line scheme, however, requires large current drive capability to discharge a word line from a boosted voltage of Vpp to the negative voltage of Vbb or Vnn during a word line precharge operation. These large discharge currents cause fluctuations in the negative voltage supply. The drive circuitry for a negative word line scheme places additional demands on the negative voltage generator because it consumes additional operating current from the negative voltage supply.

Another problem with the prior art negative voltage generator is that the voltage gain of the detector 300 is very low (~0.1), so the response time is slow. This causes a long on/off delay time (~1 us) which results in a large ripple component in the negative voltage Vbb as shown in FIG. 3. A further problem with the detector is that it is highly sensitive to process and temperature variations.

SUMMARY

A negative voltage generator in accordance with the present invention is controlled responsive to a word line precharge signal.

One aspect of the present invention is a negative voltage generator for a semiconductor memory device comprising: a first charge pump having an output; and a second charge pump having an output coupled to the output of the first charge pump, wherein the second charge pump is adapted to be controlled by a word-line precharge signal. Another aspect is a method for operating a semiconductor memory device comprising controlling a negative voltage generator responsive to a word line precharge signal.

Another aspect of the present invention is a level detector for a semiconductor device comprising: a differential amplifier having a first input and a second input; a first voltage divider coupled to the first input of the differential amplifier; and a second voltage divider coupled to the second input of the differential amplifier, and adapted to drive the second input of the differential amplifier responsive to an output signal. Another aspect is a method for detecting a voltage in a semiconductor device comprising: dividing a reference signal, thereby generating a first divided signal; dividing the voltage, thereby generating a second divided signal; and amplifying the difference between the first and second divided signals.

A further aspect of the present invention is a negative voltage regulator for a semiconductor device comprising: a differential amplifier having a first input, a second input, and an output; an output transistor coupled to the output of the differential amplifier; a first voltage divider coupled to the first input of the differential amplifier; and a second voltage divider coupled to the second input of the differential amplifier, and adapted to drive the second input of the differential amplifier responsive to an output signal from the output transistor. Another aspect is a method for generating a first negative voltage in a semiconductor device comprising: generating a second negative voltage; dividing a reference signal, thereby generating a first divided signal; dividing the first negative voltage, thereby generating a second divided signal; amplifying the difference between the first and second divided signals, thereby generating a drive signal; and driving an output transistor coupled between the first negative voltage and the second negative voltage responsive to the drive signal.

Yet another aspect of the present invention is a semiconductor memory device having a negative word line scheme comprising a negative voltage generator comprising: a charge pump adapted to generate a first negative voltage, and a negative voltage regulator coupled to the negative charge pump and adapted to generate a second negative voltage by regulating the first negative voltage. Another aspect is a method for driving a word line in a semiconductor memory device having a negative word line scheme comprising: generating a first negative voltage; generating a second negative voltage by regulating the first negative voltage; and driving the word line with the second negative voltage.

These and other aspects of the present invention are disclosed and claimed.

DETAILED DESCRIPTION

Negative Voltage Generator

Figure 4:
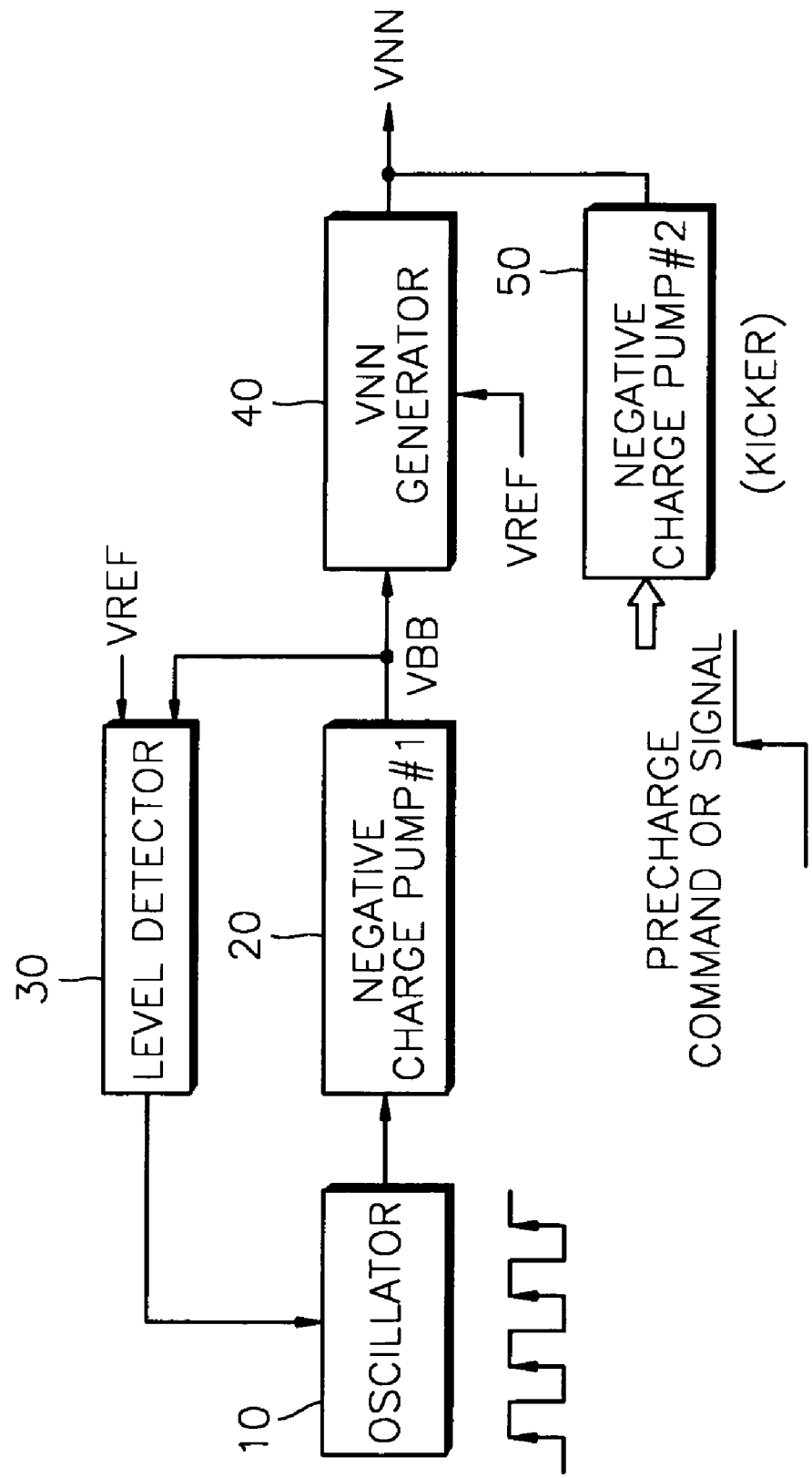
FIG. 4 is a diagram of an embodiment of a negative voltage generator in accordance with the present invention.
Figure 5:
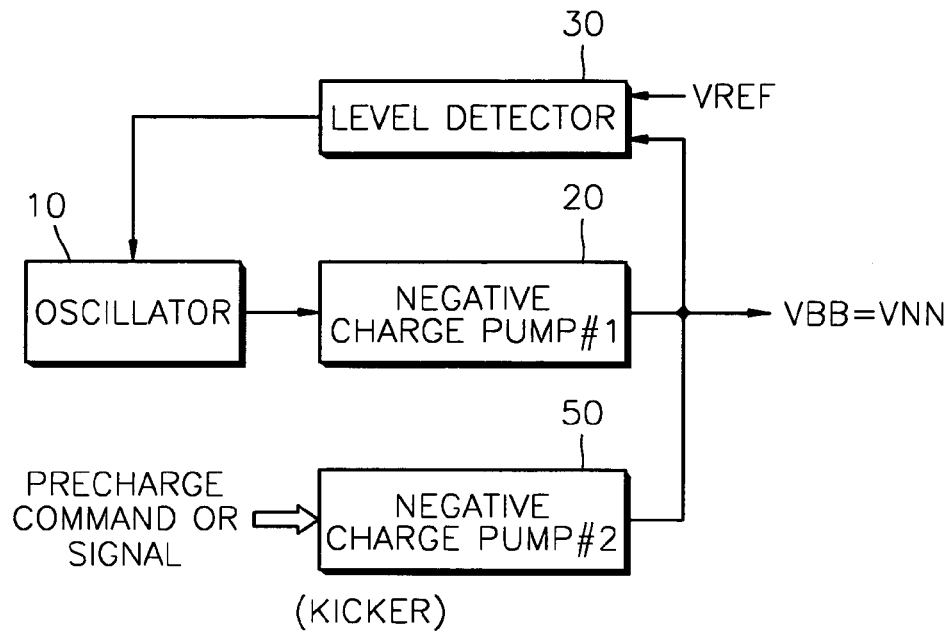
FIG. 5 is a diagram of a second embodiment of a negative voltage generator in accordance with the present invention.
Figure 6:
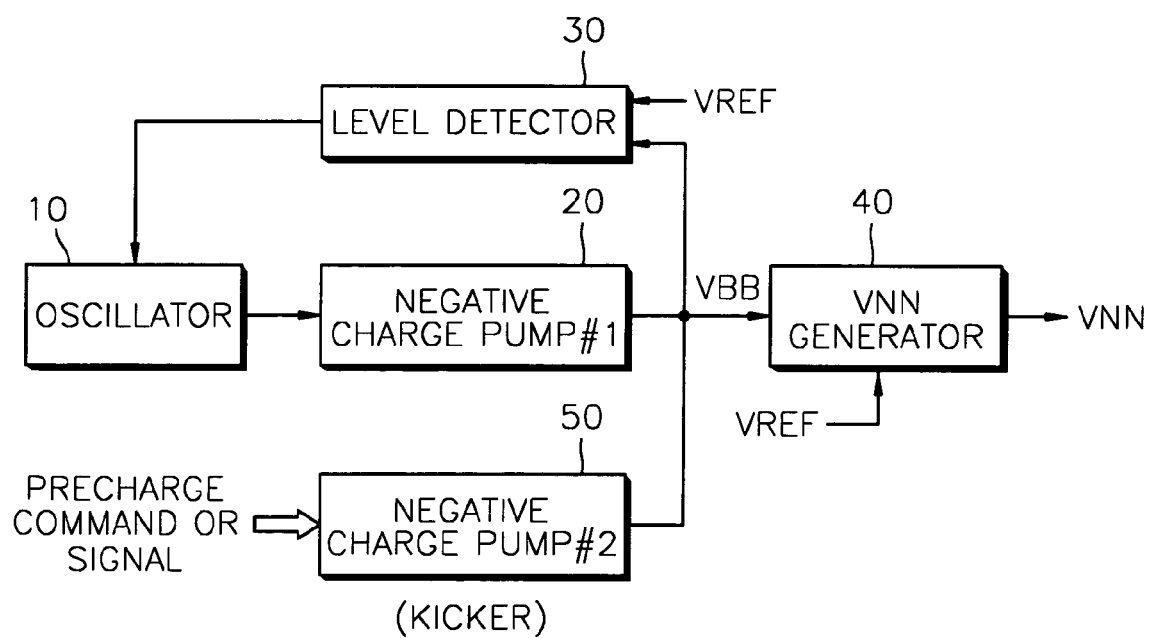
FIG. 6 is a diagram of a third embodiment of a negative voltage generator in accordance with the present invention.

FIG. 4 is a diagram of an embodiment of a negative voltage generator in accordance with the present invention. The embodiment of FIG. 4 includes an oscillator 10, a first negative charge pump 20 having an output Vbb, and a level detector 30 arranged as in the prior art. However, the embodiment of FIG. 4 further includes a second negative charge pump 50 having an output coupled to the output of the first negative charge pump 20, either through a Vnn generator 40 as shown in FIG. 4, or through a direct connection as shown in FIGS. 5 and 6, or through any other suitable arrangement. The second negative charge pump 50 (also referred to as a "kicker") is activated and supplies additional negative charge for shutting off a word line responsive to a precharge command or signal. The second negative charge pump is preferably designed to provide an accurately pre-determined amount of negative charge. Thus, by providing most of the precharge current required to shut off a word line, the second charge pump dramatically reduces voltage fluctuations on the negative voltage supply.

In a preferred embodiment, the second charge pump is constructed essentially the same as the first charge pump, but it is activated responsive to a precharge command or signal. The capacitor in the second charge pump is preferably sized to discharge just the right amount of charge from a word line during a precharge operation.

Since most semiconductor memory devices operate from positive power supplies that are referenced to a power supply ground, a back bias scheme is described in terms of a negative voltage. However, as used herein, negative is understood to mean simply the reverse polarity from that applied to a word line during an access operation.

Figure 1:
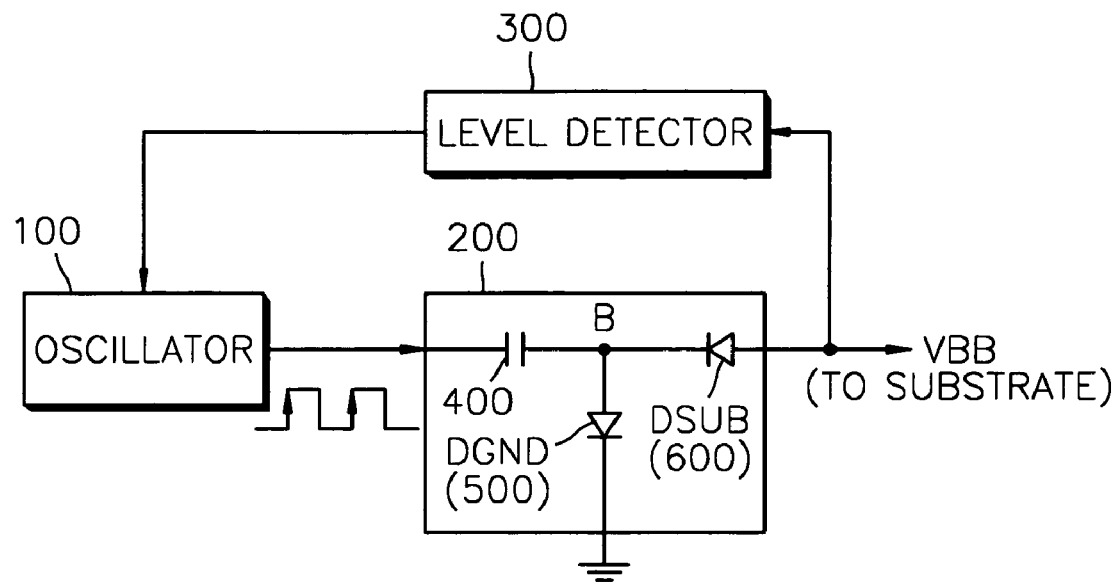
FIG. 1 is a diagram of a prior art negative voltage generator.

The level detector 30 performs the same function as the level detector 300 in FIG. 1, but in a preferred embodiment, it is replaced with a detector having faster response time and greater immunity to process and temperature variations in accordance with the present invention such as that shown in FIG. 8 below.

The embodiment shown in FIG. 4 further includes an optional Vnn generator 40 which is a voltage regulator that generates Vnn by canceling ripple in Vbb. Thus, a more stable negative word line bias can be obtained using the Vnn supply. A preferred embodiment of a negative voltage regulator is described below with respect to FIGS. 10 and 11. An advantage of using a negative voltage regulator in accordance with the present invention is that it cancels ripple in Vbb. Thus, it provides a more stable negative word line bias. Another advantage is that, since Vnn (typically about −0.5 Volts) is less negative than Vbb (typically about −1.0 Volts), it reduces the total amount of charge that must be removed from a word line during a precharge operation. A further advantage of using a negative voltage regulator to reduce the negative word line bias voltage is that the drive circuitry for the negative word line driving scheme dissipates less power.

Figure 7:
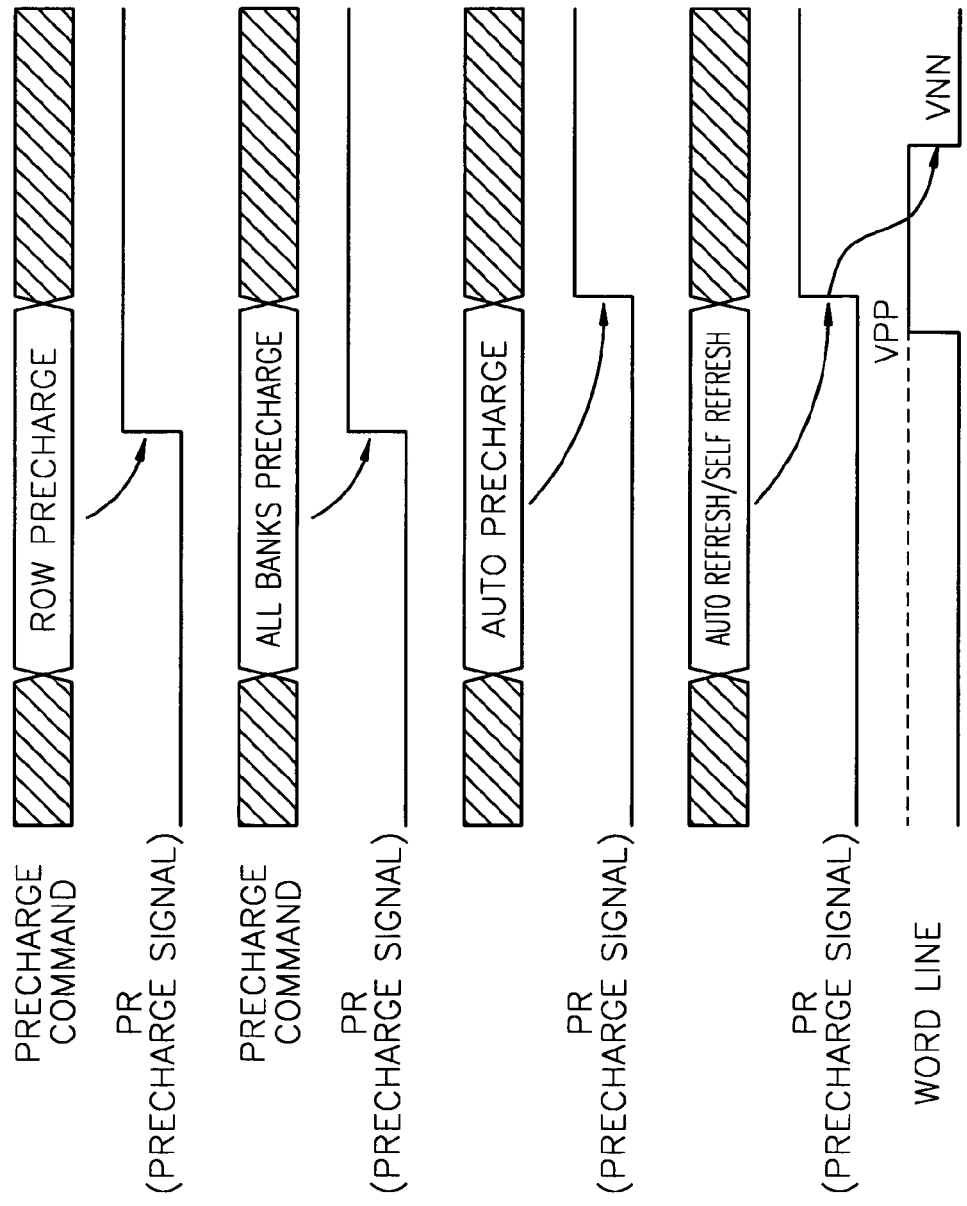
FIG. 7 is a timing diagram of some example word line precharge commands and signals suitable for use with the present invention.

Examples of precharge commands and signals suitable for triggering the second negative charge pump are shown in FIG. 7 which is a timing diagram of commands and signals for a Synchronous Dynamic Random Access Memory (SDRAM) device. Precharge commands are typically external commands such as Row Precharge, Auto Precharge, All Banks Precharge, etc. Signals are typically internal signals such as PR in FIG. 7. The present invention, however, is not limited use with these commands and signals, or to SDRAM devices. The present invention can be adapted to work with any other suitable commands and/or signals that anticipate or correspond to a precharge operation for a word line. Pprecharge command and signal will be used interchangeably. Thus, precharge command or signal is understood to refer to any suitable command and/or signal that anticipates or corresponds to a precharge operation for a word line. Moreover, the present invention is not limited to use with word lines, but can also be used with any other type of memory access line the operates with a negative precharge voltage.

FIG. 5 is a diagram of another embodiment of a negative voltage generator in accordance with the present invention. In the embodiment of FIG. 5, there is no negative voltage regulator, and the output of the second negative charge pump 50 is connected directly to the output of the first negative charge pump 20. In this configuration, Vbb and Vnn are the same signal, and the second charge pump is designed to deliver the predetermined negative charge directly to the word line control circuit in response to a word line precharge command or signal.

FIG. 6 is a diagram of a third embodiment of a negative voltage generator in accordance with the present invention. The embodiment of FIG. 6 is the same as the embodiment of FIG. 5 except that it includes a negative voltage regulator 40 which has an input coupled to the outputs of the first and second charge pumps, and an output that generates the regulated Vnn signal.

Level Detector

Figure 8:
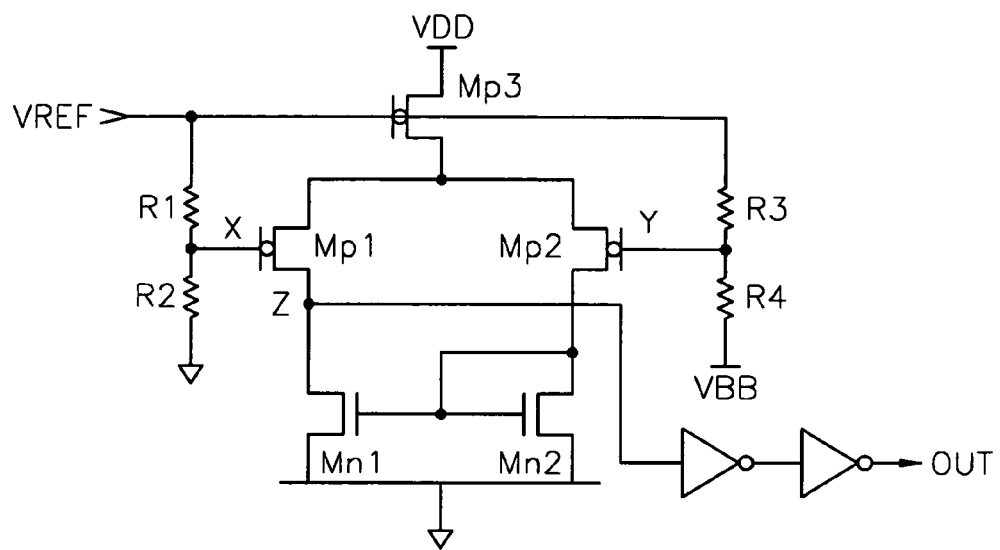
FIG. 8 is a schematic diagram of an embodiment of a level detector in accordance with the present invention.

FIG. 8 is a schematic diagram of an embodiment of a level detector in accordance with the present invention. The level detector of FIG. 8 includes a first voltage divider formed from resistors R1 and R2, a second voltage divider formed from resistors R3 and R4, a differential amplifier formed from transistors MP2, Mp2, Mp3, Mn1, and Mn2, and one or more inverters INV1, INV2. The first divider is connected between an internal reference voltage Vref and a power supply ground. The second divider is connected between the internal reference voltage Vref and the negative power supply, in this case Vbb. The voltage dividers divide the voltage between Vref and ground and between Vref and Vbb, thereby generating two divided signals X and Y which operate as comparison signals in response to Vref and Vbb according to the following equations:

$$X = Vref \cdot \frac{R2}{R1+R2} \text{ and } Y = (Vref - Vbb) \cdot \frac{R4}{R3+R4}$$

Vref is a stable reference voltage, so X has a constant value, and the output Z will depend on whether Y is higher or lower than X. The target level for Vbb is given by:

$$Vbb = Vref \cdot \frac{R2R3 - R1R4}{R1R3 + R2R3}$$

Transistors Mp1, Mp2, Mp3, Mn1, and Mn2 are arranged as a differential amplifier with Mp3 forming a current source that biases Mp1 and Mp2 which are arranged as a differential pair of input transistors. Transistors Mn1 and Mn2 are arranged as a current mirror load referenced to the power supply ground. The output Z is taken from the connection between the drains of Mp1 and Mn1 and applied to the input of inverter INV1.

Figure 9:
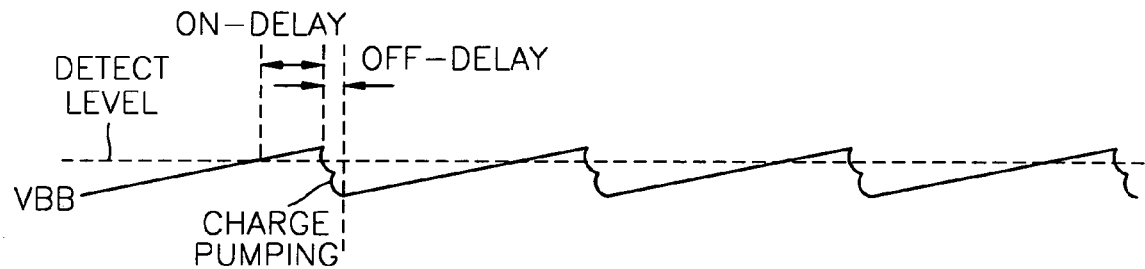
FIG. 9 illustrates the operation of an embodiment of a level detector in accordance with the present invention.

Since the differential amplifier has a high voltage gain (typically about 50), the output Z will swing quickly past the switching point of inverter INV1 as Y swings above and below X. The high gain characteristic of the differential amplifier reduces the on/off delay of the detector as shown in FIG. 9. This, in turn, reduces fluctuations in the negative voltage supply.

Another advantage of the level detector shown in FIG. 8 is that the resistor divided voltage levels X and Y are insensitive to process and temperature variations, so the detector is also insensitive to these variations.

A further advantage is that, by connecting the voltage dividers to Vref instead of a positive power supply such as Vdd or a boosted voltage source such as Vpp, the level detector can be made insensitive to variations in the supply voltage, as happens, for example when Vdd is increased during a testing operation.

Yet another advantage of the level detector shown in FIG. 8 is that the current mirror load is referenced to the power supply ground terminal rather than the Vbb terminal. This reduces the current draw from Vbb.

An additional advantage is that the comparison signals X and Y are biased by the voltage dividers at a quiescent voltage that is well above Vbb. This simplifies the design of the differential amplifier. In essence, the voltage dividers level shift the Vbb signal to a convenient voltage level.

Figure 2:
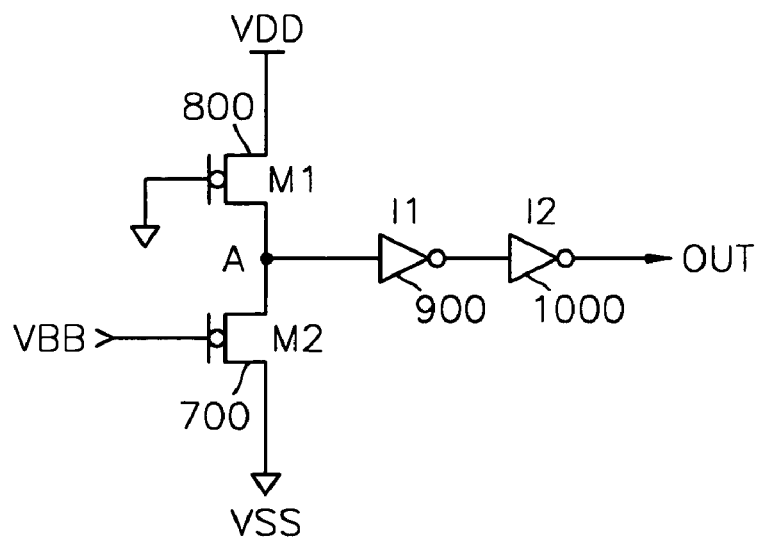
FIG. 2 is a schematic diagram of a prior art level detector.
Figure 3:
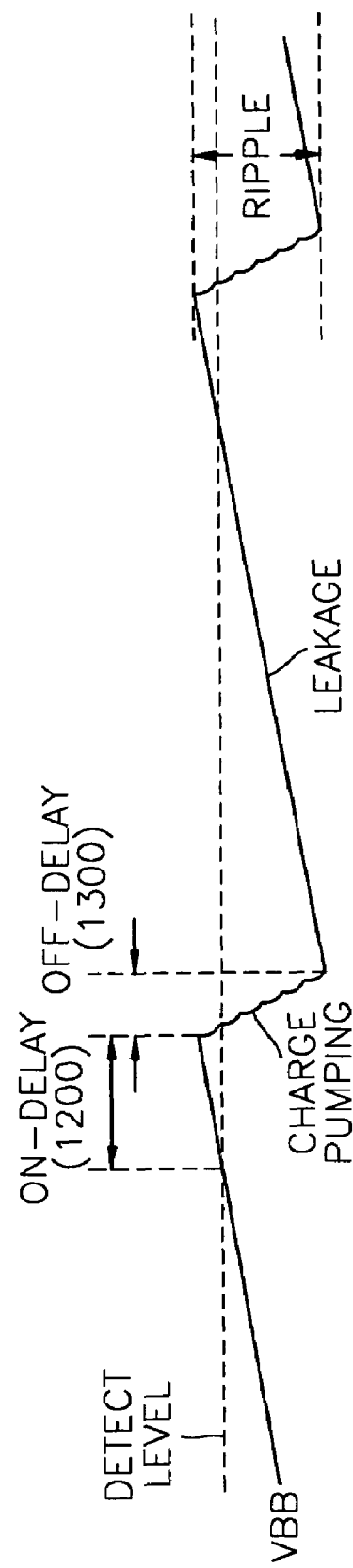
FIG. 3 illustrates the operation of a prior art negative voltage generator and level detector.

A level detector in accordance with the present invention can be substituted anywhere for the conventional level detector shown in FIG. 2 and is not limited to applications using a negative word line scheme.

Negative Voltage Regulator

Figure 10:
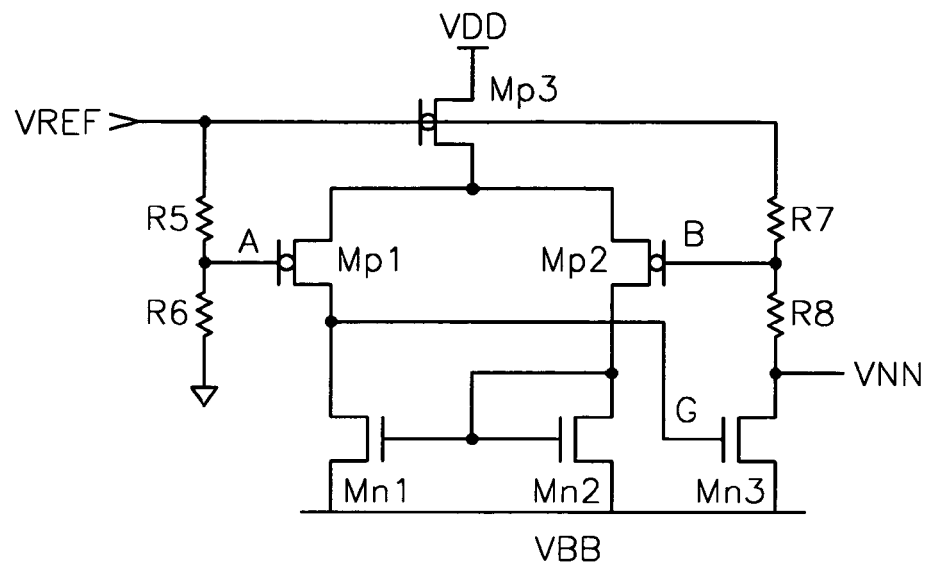
FIG. 10 is a schematic diagram of an embodiment of a negative voltage regulator in accordance with the present invention.

FIG. 10 is a schematic diagram of an embodiment of a negative voltage regulator (Vnn generator) in accordance with the present invention. The regulator of FIG. 10 includes a first voltage divider formed from resistors R5 and R6, a second voltage divider formed from resistors R7 and R8, a differential amplifier formed from transistors Mp1, Mp2, Mp3, Mn1, and Mn2, and an output transistor Mn3.

The first divider is connected between an internal reference voltage Vref and a power supply ground. The second divider is connected between the internal reference voltage Vref and the drain of transistor Mn3. The source of Mn3 is connected to the negative power supply Vbb, and the gate of Mn3 is connected to the output of the differential amplifier at node G between the drains of Mn1 and Mp1.

Transistors Mp1, Mp2, Mp3, Mn1, and Mn2 are arranged as a differential amplifier with Mp3 forming a current source that biases Mp1 and Mp2 which are arranged as a differential pair of input transistors. Transistors Mn1 and Mn2 are arranged as a current mirror load referenced to the negative power supply Vbb.

The voltage dividers divide the voltage between Vref and ground and between Vref and Vnn, thereby generating two divided signals A and B which operate as comparison signals in response to Vref and Vnn. Since the regulator is connected in a negative feedback arrangement, the voltages on nodes A and B are forced to the same value. Thus, Vnn is given by the following equation:

$$Vnn = Vref \cdot \frac{R6R7 - R5R8}{R5R8 + R6R8}$$

Figure 11:
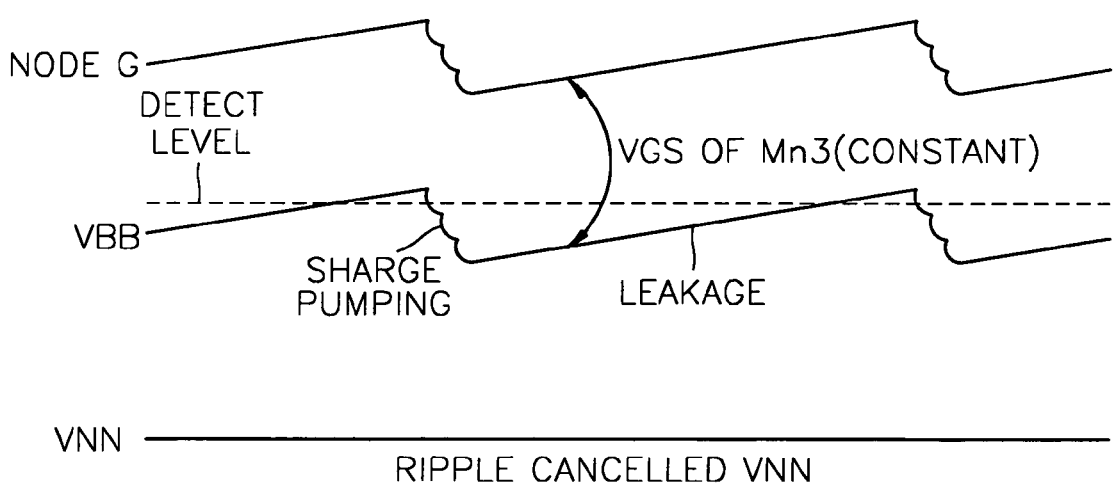
FIG. 11 illustrates the operation of an embodiment of a negative voltage regulator in accordance with the present invention.

As the voltage of Vbb varies, the voltage at node G tracks in the same phase as Vbb so that the gate-to-source voltage of Mn3 remains constant and the Vbb ripple caused by the detector on/off time is cancelled at Vnn as shown in FIG. 11.

An advantage of the negative voltage regulator of FIG. 10 is that the voltage dividers bias the comparison signals A and B at a quiescent voltage that is well above Vnn. This greatly simplifies the regulator circuit as compared to other regulators which typically have comparison signals that are biased at about the same voltage level as Vnn. In essence, the voltage dividers level shift the signals to a convenient voltage level.

Having described and illustrated the principles of the invention in some preferred embodiments thereof, it should be apparent that the invention can be modified in arrangement and detail without departing from such principles. We claim all modifications and variations coming within the spirit and scope of the following claims.

The invention claimed is:

1. A voltage generator configured to bias a word line from a boosted voltage having a first polarity to a second voltage having a second polarity, the voltage generator comprising:
   a first charge pump having an output;
   a second charge pump having an output coupled to the output of the first charge pump, wherein the second charge pump is adapted to be controlled by a precharge signal; and
   a voltage regulator having an input directly coupled to the output of the first charge pump and an output directly coupled to the output of the second charge pump.

2. The voltage generator of claim 1, wherein the output of the first charge pump is connected directly to the output of the second charge pump.

3. The voltage generator of claim 2, further comprising: a voltage regulator having an input coupled to the outputs of the first and second charge pumps.

4. The voltage generator of claim 1, further comprising:
a level detector having an input coupled to the output of the first charge pump.

5. The voltage generator of claim 1, wherein the precharge signal is a word-line precharge signal.

6. A voltage generator configured to bias a word line from a boosted voltage having a first polarity to a second voltage having a second polarity, the voltage generator comprising:
first means for pumping charge to a voltage source;
second means for pumping charge to the voltage source, wherein the second means for pumping charge is adapted to be controlled by a precharge signal; and
means for regulating the voltage source, the means for regulating the voltage source having an input directly coupled to an output of the first means for pumping charge and having an output directly coupled to an output of the second means for pumping charge.

7. The voltage generator of claim 6, further comprising:
means for detecting the voltage level of the voltage source.

8. The voltage generator of claim 6, wherein the voltage source is a voltage source for negatively biasing a word line.

9. A voltage generator configured to bias a word line from a boosted voltage having a first polarity to another voltage having a second polarity, the voltage generator comprising:
an oscillator;
a first charge pump having an input coupled to the oscillator and an output for generating a first voltage responsive to an oscillating signal from the oscillator;
a voltage regulator having an input directly coupled to the output of the first charge pump and an output for generating a second voltage responsive to the first voltage; and
a second charge pump having an output directly coupled to the output of the voltage regulator, wherein the second charge pump is adapted to be controlled by a word-line precharge signal.

10. The voltage generator of claim 9, further comprising:
a level detector having an input coupled to the output of the first charge pump and an output coupled to the oscillator.

11. The voltage generator of claim 9, wherein the second charge pump is adapted to pump a predetermined amount of charge to the second voltage responsive to the word-line precharge signal.

* * * * *